United States Patent
Kim et al.

(10) Patent No.: US 9,230,737 B2
(45) Date of Patent: Jan. 5, 2016

(54) MULTILAYER CERAMIC ELECTRONIC COMPONENT HAVING A CONDUCTIVE PASTE

(71) Applicant: SAMSUNG ELECTRO-MECHANICS CO., LTD., Suwon, Gyunggi-do (KR)

(72) Inventors: Joon Hee Kim, Gyunggi-do (KR); Jong Han Kim, Gyunggi-do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 198 days.

(21) Appl. No.: 13/954,760

(22) Filed: Jul. 30, 2013

(65) Prior Publication Data

US 2013/0314840 A1     Nov. 28, 2013

Related U.S. Application Data

(62) Division of application No. 13/033,277, filed on Feb. 23, 2011, now Pat. No. 9,053,856.

(30) Foreign Application Priority Data

Dec. 6, 2010   (KR) .......................... 10-2010-0123420

(51) Int. Cl.
*H01G 4/008*     (2006.01)
*H01G 4/12*      (2006.01)
*H05K 1/09*      (2006.01)
(Continued)

(52) U.S. Cl.
CPC .............. *H01G 4/008* (2013.01); *B22F 1/0059* (2013.01); *H01B 1/22* (2013.01); *H01G 4/005* (2013.01); *H01G 4/12* (2013.01); *H01G 4/30* (2013.01); *H01L 23/49883* (2013.01); *H05K 1/092* (2013.01); *H01L 2924/0002* (2013.01); *Y10T 29/49155* (2015.01)

(58) Field of Classification Search
None
See application file for complete search history.

(56) References Cited

U.S. PATENT DOCUMENTS

2006/0197062 A1   9/2006  Nakamura
2007/0108419 A1*  5/2007  Satou et al. ................... 252/500
(Continued)

FOREIGN PATENT DOCUMENTS

JP    08-111346       4/1996
JP    2003-249121 A   9/2003
(Continued)

OTHER PUBLICATIONS

U.S. Office Action dated Aug. 1, 2014 issued in U.S. Appl. No. 13/033,277.
(Continued)

*Primary Examiner* — Harold Pyon
*Assistant Examiner* — Katie L Hammer
(74) *Attorney, Agent, or Firm* — McDermott Will & Emery LLP

(57) ABSTRACT

Disclosed are a conductive paste for an inner electrode and a multilayer ceramic electronic component having the same. There is provided a conductive paste for an inner electrode, including: a conductive metal powder for manufacturing the inner electrode for multilayer ceramic electronic component; an organic binder including at least one selected from a group consisting of acryl-based resin, butyral-based resin, and a cellulose-based resin to disperse the conductive metal powder; and a solvent including eucalyptol.

7 Claims, 3 Drawing Sheets

(51) Int. Cl.
  *B22F 1/00* (2006.01)
  *H01L 23/498* (2006.01)
  *H01B 1/22* (2006.01)
  *H01G 4/005* (2006.01)
  *H01G 4/30* (2006.01)

(56) References Cited

U.S. PATENT DOCUMENTS

2008/0105853 A1   5/2008  Ueda et al.
2009/0032293 A1   2/2009  Miyakawa et al.
2010/0221559 A1*  9/2010  Konno et al. .............. 428/457

FOREIGN PATENT DOCUMENTS

JP     2005-158563 A   6/2005
JP     2007-095382 A   4/2007
WO   WO 2009044801 A1 *  4/2009

OTHER PUBLICATIONS

Non-Final Office Action U.S. Appl. No. 13/033,277 dated Mar. 18, 2014.

English text machine translation of Takada et al. (JP 08-111346), accessed online from AIPN and attached as a PDF.

Office Action issued in Japanese Patent Application No. 2011-037956 dated Jun. 25, 2013.

Notice of Allowance dated Feb. 12, 2015 issued in U.S. Appl. No. 13/033,277.

* cited by examiner

MULTILAYER CERAMIC ELECTRONIC COMPONENT HAVING A CONDUCTIVE PASTE

CROSS-REFERENCE TO RELATED APPLICATIONS

This application is a divisional of U.S. patent application Ser. No. 13/033,277, filed on Feb. 23, 2011, which claims the priority of Korean Patent Application No. 10-2010-0123420 filed on Dec. 6, 2010, in the Korean Intellectual Property Office, the disclosures of which are incorporated herein by reference.

BACKGROUND OF THE INVENTION

1. Field of the Invention

The present invention relates to a conductive paste for an inner electrode and a multilayer ceramic electronic component having the same, and more particularly, to a conductive paste for an inner electrode capable of forming an inner electrode with improved electrical characteristics and electrical connectivity and a multilayer ceramic electronic component having the same.

2. Description of the Related Art

Recently, as various electronic devices have been miniaturized, the demand for compact, multi-functional electronic components to be mounted in electronic devices has increased. In particular, as the stacking number is increased even in multilayer ceramic electronic components, such as a multilayer ceramic capacitor, or the like, the demand for thinness in individual layers thereof has increased.

In order to manufacture a multilayer ceramic electronic component such as a multilayer ceramic capacitor, or the like, a dielectric paste for a ceramic green sheet is first produced by mixing a ceramic powder, an organic binder such as an acrylic resin or a butyral resin, a plasticizer such as a phthalate ester, a glycol, adipic acid, a phosphate ester, or the like, and an organic solvent such as toluene, methyl ethyl ketone, acetone, or the like, and dispersing a mixture thereof.

Next, the ceramic green sheet is produced by applying the dielectric paste to a carrier film such as polyethylene terephthalate, polypropylene, or the like, by using a roller coater method, or the like, and firing the dielectric paste.

Thereafter, a conductive paste is produced by dissolving a conductive powder such as nickel powder in an organic binder and a solvent, and the inner electrode is then produced by printing the conductive paste on the ceramic green sheet by a screen printing method, or the like, and drying it.

Recently, in order to develop a super capacity MLCC having a layer thickness of 1 μm or less, the thickness of the inner electrodes thereof is also being slimmed. Since it is difficult to produce a thin film inner electrode by the screen printing method according to the related art, an attempt to form a thin film inner electrode through a gravure printing method has been conducted.

In the case of a fast printing method, such as the gravure printing method, the drying rate of a solvent therein is faster than that which is required for the screen printing method. That is, a boiling point of a solvent should be relatively low in order to dry a solvent at high speed.

In addition, the particle size of the nickel powder included in the conductive paste for an inner electrode used for the gravure printing is relatively small, such that the viscosity of the conductive paste is increased due to the increase in the specific surface area of the powder. Therefore, there is a need to develop a low-viscosity solvent since it is difficult to lower the viscosity of paste by using an existing solvent.

SUMMARY OF THE INVENTION

An aspect of the present invention provides a conductive paste for an inner electrode capable of forming an inner electrode with improved electrical characteristics and electrical connection by providing a conductive paste solvent for an inner electrode having low boiling point and low viscosity characteristics, and a multilayer ceramic electronic component having the same.

According to an aspect of the present invention, there is provided a conductive paste for an inner electrode, including: a conductive metal powder; an organic binder including at least one selected from a group consisting of acryl-based resin, butyral-based resin, and a cellulose-based resin; and a solvent including eucalyptol.

The solvent may further include dihydroxy terephthalic acid.

The solvent may further include at least one selected from a group consisting of p-cymene, α-pinene, and d-limonene.

The content of eucalyptol may be 30 to 60 parts by weight, the content of dihydroxy terephthalic acid may be 20 to 30 parts by weight, and the content of at least one selected from a group consisting of p-cymene, α-pinene, d-limonene may be 20 to 40, per 100 parts by weight of solvent.

The solvent may include p-cymene and the content of p-cymene may be 30 to 40 parts by weight per 100 parts by weight of solvent.

The conductive metal powder may be at least one selected from a group consisting of Ni powder, Ag powder, Cu powder, and Pd powder.

The content of conductive metal powder may be 45 to 50 parts by weight per 100 parts by weight of conductive paste.

The size of the conductive metal powder particles may be 200 nm or less.

According to another aspect of the present invention, there is provided a multilayer ceramic electronic component, including: a multilayer main body formed by stacking a plurality of ceramic layers; a plurality of inner electrodes formed by printing on the plurality of ceramic layers a conductive paste for an inner electrode including a conductive metal powder, an organic binder including at least one selected from a group consisting of acryl-based resin, butyral-based resin, and a cellulose-based resin, and a solvent including eucalyptol; and a first external electrode and a second external electrode formed at both ends of the multilayer main body to be electrically connected to the inner electrodes.

The solvent may further include dihydroxy terephthalic acid.

The solvent may further include at least one selected from a group consisting of p-cymene, α-pinene, and d-limonene.

The content of eucalyptol may be 30 to 60 parts by weight, the content of dihydroxy terephthalic acid may be 20 to 30 parts by weight, and the content of at least one selected from a group consisting of p-cymene, α-pinene, d-limonene may be 20 to 40, per 100 parts by weight of solvent.

The solvent may include p-cymene and the content of p-cymene may be 30 to 40 parts by weight per 100 parts by weight of solvent.

The conductive metal powder may be at least one selected from a group consisting of Ni powder, Ag powder, Cu powder, and Pd powder.

The content of conductive metal powder may be 45 to 50 parts by weight per 100 parts by weight of conductive paste.

The size of the conductive metal powder particles may be 200 nm or less.

According to another aspect of the present invention, there is provided a method for manufacturing a multilayer ceramic electronic component, including: preparing a conductive paste for an inner electrode including a conductive metal powder, an organic binder including at least one selected from a group consisting of acryl-based resin, butyral-based resin, and a cellulose-based resin, and a solvent including eucalyptol; forming an inner electrode by printing the conductive paste on the ceramic sheet; and forming a multilayer main body in which a plurality of ceramic layers are formed by cutting and stacking a ceramic sheet printed with the inner electrode.

The inner electrode may be formed by a gravure printing method.

The solvent may further include dihydroxy terephthalic acid.

The solvent may further include at least one selected from a group consisting of p-cymene, α-pinene, and d-limonene.

The content of eucalyptol may be 30 to 60 parts by weight, the content of dihydroxy terephthalic acid is 20 to 30 parts by weight, and the content of at least one selected from a group consisting of p-cymene, α-pinene, d-limonene may be 20 to 40, per 100 parts by weight of solvent.

The solvent may include p-cymene and the content of p-cymene may be 30 to 40 parts by weight per 100 parts by weight of solvent.

The conductive metal powder for the conductive paste may be at least one selected from a group consisting of Ni powder, Ag powder, Cu powder, and Pd powder.

The content of conductive metal powder may be 45 to 50 parts by weight per 100 parts by weight of conductive paste.

The size of the conductive metal powder particles may be 200 nm or less.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
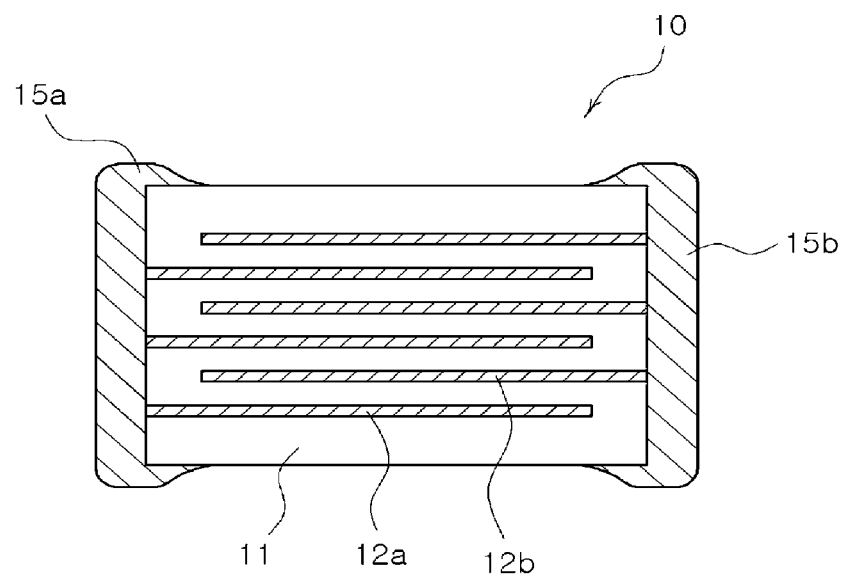
FIG. 1 is a cross-sectional view of multilayer ceramic electronic component according to an exemplary embodiment of the present invention.

Hereinafter, exemplary embodiments of the present invention will be described in detail with reference to the accompanying drawings, which will fully convey the concept of the invention to those skilled in the art. Moreover, detailed descriptions related to well-known functions or configurations will be ruled out in order not to unnecessarily obscure the subject matter of the present invention. It is also noted that like reference numerals denote like elements in appreciating the drawings.

It will be understood that when an element is referred to as being "connected to" another element, it can be directly connected to the other element or intervening elements may also be present. In contrast, when an element is referred to as being "directly connected to" another element, there are no intervening elements present. In addition, unless explicitly described to the contrary, the word "comprise" and variations such as "comprises" or "comprising," as well as the word "include" and variations such as "includes" and "including," will be understood to imply the inclusion of stated elements but not the exclusion of any other elements.

Figure 2:
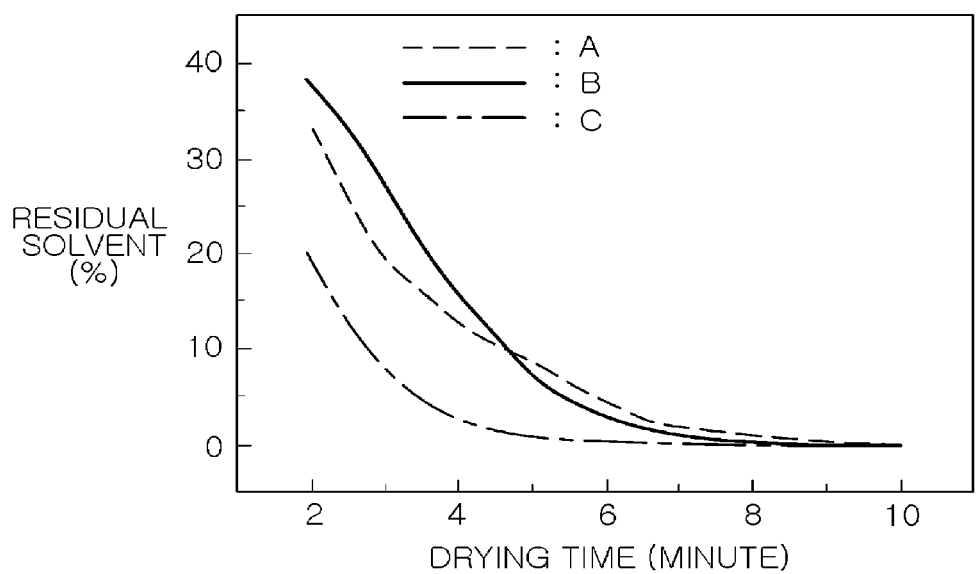
FIG. 2 is a graph showing a drying time of a conductive paste according to the exemplary embodiment of the present invention.
Figure 3A:
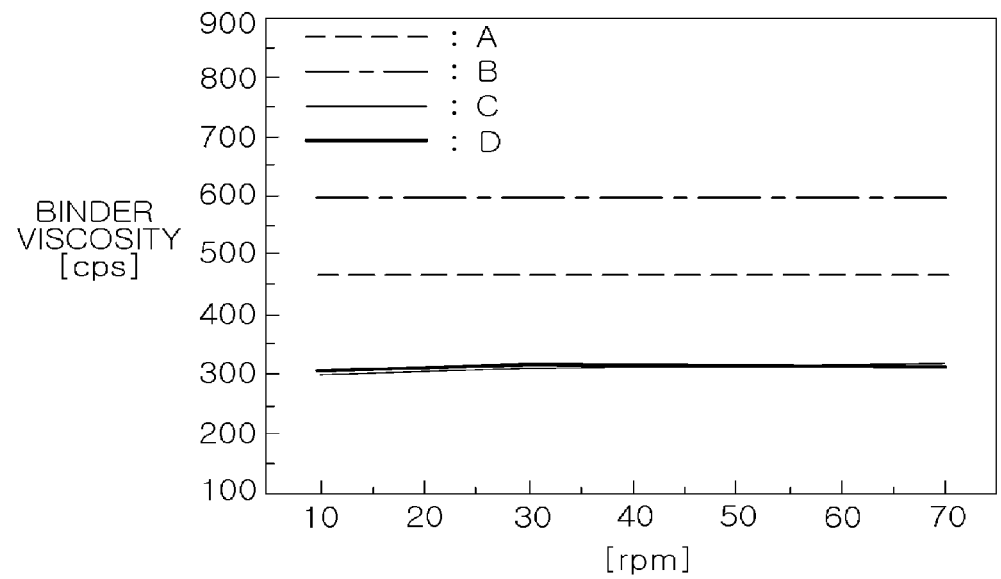
FIG. 3A is a graph showing viscosity of an organic binder according to a solvent of the exemplary embodiment of the present invention.
Figure 3B:
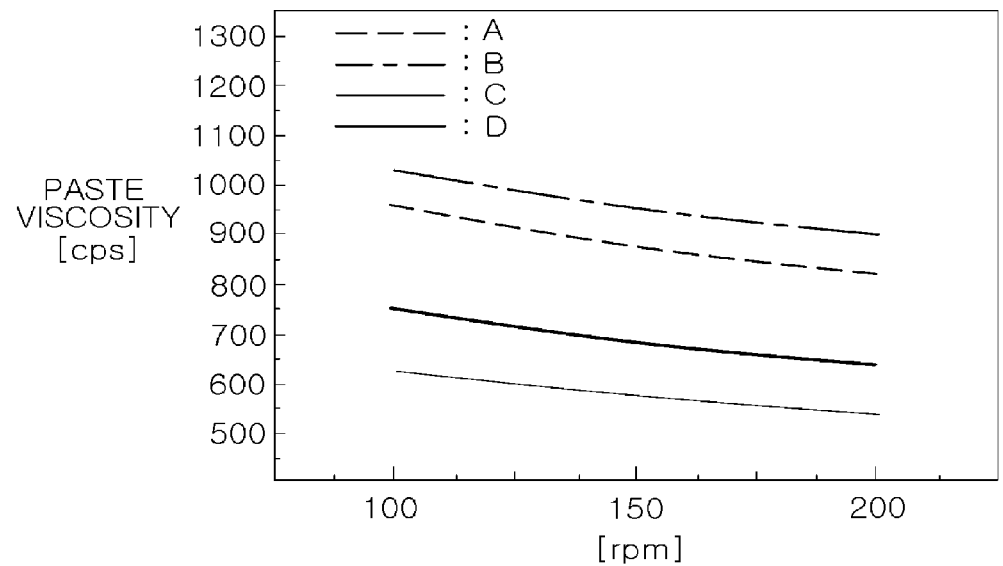
FIG. 3B is a graph showing viscosity of the conductive paste according to the solvent of the exemplary embodiment of the present invention.
Figure 4A:
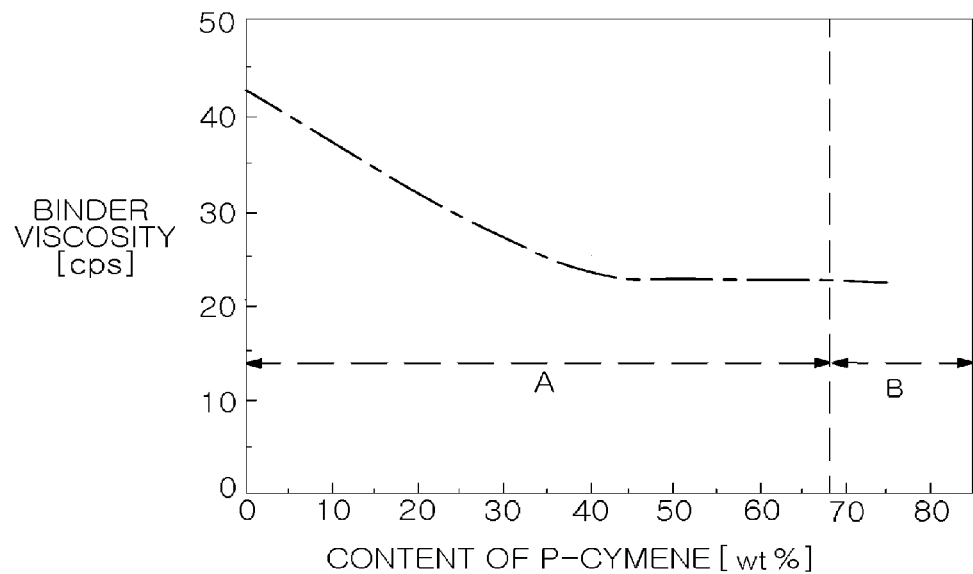
FIG. 4A is a graph showing the viscosity of an organic binder according to a content of p-cymene according to the exemplary embodiment of the present invention.
Figure 4B:
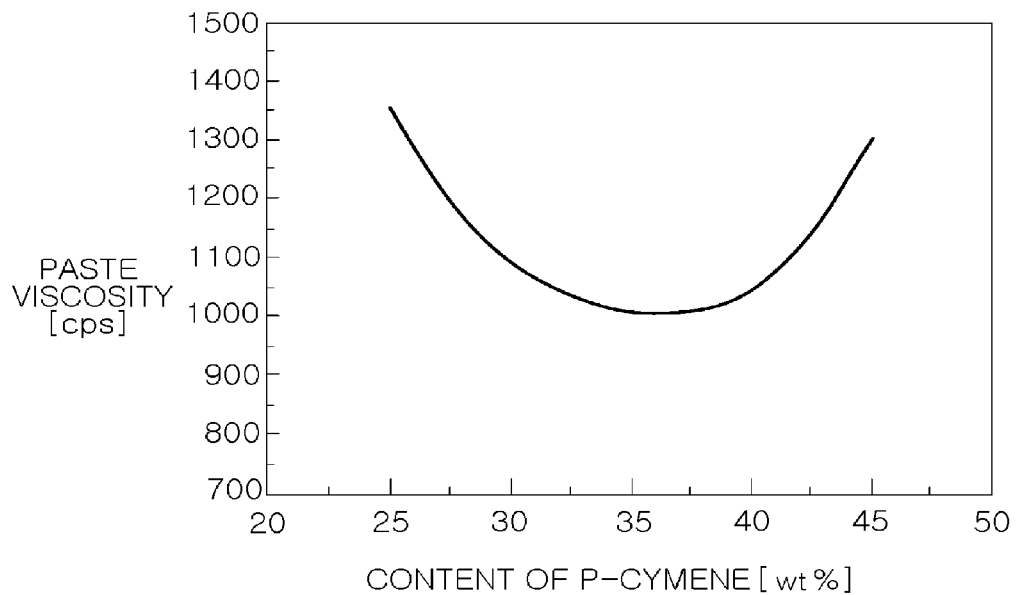
FIG. 4B is a graph showing the viscosity of a paste according to a content of p-cymene according to the exemplary embodiment of the present invention.

FIG. 1 is a cross-sectional view of multilayer ceramic electronic component according to an exemplary embodiment of the present invention, FIG. 2 is a graph showing a drying time of a conductive paste according to the exemplary embodiment of the present invention, FIG. 3A is a graph showing viscosity of an organic binder according to a solvent of the exemplary embodiment of the present invention, and FIG. 3B is a graph showing viscosity of the conducive paste according to the solvent of the exemplary embodiment of the present invention, FIG. 4A is a graph showing the viscosity of an organic binder according to a content of p-cymene according to the exemplary embodiment of the present invention, and FIG. 4B is a graph showing the viscosity of a paste according to a content of p-cymene according to the exemplary embodiment of the present invention.

Hereinafter, a conductive paste for an inner electrode and a method of manufacturing multilayer ceramic electronic component having the same according to an exemplary embodiment of the present invention will be described with reference to FIGS. 1 to 4.

FIG. 1 is a cross-sectional view of multilayer ceramic electronic component according to an exemplary embodiment of the present invention.

Referring to FIG. 1, a multilayer ceramic capacitor 10 is configured to include a ceramic sintering body part 11 formed with cover layers provided on both surfaces thereof as outermost layers and by stacking a plurality of ceramic layers therebetween.

First and second inner electrodes 12a and 12b are formed to be alternately disposed on the plurality of ceramic layers, having one ceramic layer disposed therebetween. First and second external electrodes 15a and 15b are formed on opposing both surfaces of the ceramic sintering body part 11 and each of them is connected to the first and second inner electrodes 12a and 12b.

In order to manufacture the multilayer ceramic capacitor 10, the first inner electrode 12a and the second inner electrode 12b may be printed between the plurality of ceramic layers by a gravure printing method, or the like.

The gravure printing method injects a conductive paste for an inner electrode into a gravure roll pattern and rotates the gravure roll at high speed to pass over the ceramic layer. As a result, the inner electrode may be printed according to the pattern formed on the gravure roll.

The inner electrode formed by the gravure roll rotating at high speed may be formed by forming a low-viscosity paste in a thin film type at high speed.

Therefore, the conductive paste used for the gravure printing method should have low-viscosity characteristics to enter into the gravure roll pattern rotating at high speed, should be applied corresponding to the gravure roll rotating at high speed and should be rapidly dried.

The conductive paste for an inner electrode according to the exemplary embodiment of the present invention includes a conductive metal powder, an organic binder including at least one selected from a group consisting of acryl-based resin, a butyral-based resin, and a cellulose-based resin in order to disperse the conductive metal powder, and a solvent including eucalyptol. One of the cellulose-based resins may be ethyl cellulose.

The conductive powder is to form the inner electrode capable of conducting electricity by applying the conductive paste to the ceramic sheet and the conductive metal powder may be at least one selected from a group consisting of Ni powder, AG powder, Cu powder, and Pd powder having excellent conductivity.

Therefore, according to the exemplary embodiment of the present invention, the content of conductive metal powder may be 45 to 55 parts by weight per 100 parts by weight of conductive paste.

The conductive powder may have a particle size of 200 nm or less in order to be applied to the micro gravure roll pattern. As the particle size of the conductive metal powder becomes small, the specific surface area of the powder is increased, thereby increasing the viscosity of the paste. On the other hand, the exemplary embodiment of the present invention can lower the viscosity of the conductive paste by using a solvent having the low viscosity and the low boiling point, thereby making it possible to use the conductive powder having the particle size of 10 nm and 200 nm or less.

When the conductive paste does not include a proper amount of conductive metal powder, the film density of the inner electrode is lowered, such that the electrical connection of the inner electrode cannot be secured. Therefore, according to the exemplary embodiment of the present invention, the content of conductive metal powder may be 45 to 50 parts by weight per 100 parts by weight of conductive paste.

If the content of conductive metal powder is below 45 parts by weight, the film density of the inner electrode is lowered so that it is difficult to secure the electrical connection. If the content of conductive metal powder exceeds 50 parts by weight, the viscosity is too increased, such that it is difficult to secure the thickness of the electrode. As a result, the content of conductive metal powder may be 45 to 50 parts by weight.

According to the exemplary embodiment of the present invention, the solvent may have the low viscosity and low boiling point characteristics. Therefore, the conductive paste may have the low viscosity characteristics while including the conductive metal powder having a micro particle size.

The organic binder is to disperse the conductive metal powder into the conductive paste and the content of organic binder may be 5 to 10 parts by weight per 100 parts by weight of conductive paste.

If the content of organic binder exceeds 10 parts by weight for the conductive paste, the organic binder may be not dissolved in the solvent and if the content of organic binder is below 5 parts by weight, the conductive metal powder included in the conductive paste may not be dispersed.

An example of the organic binder may include acryl-based resin, butyral-based resin, cellulose-based resin, and a mixture thereof. The butyral-based resin is not limited thereto but may be polyvinyl butyral resin and the cellulose-based resin may be ethyl cellulose.

The solvent, which dissolves the organic binder and the conductive metal powder in the conductive paste, allows the conductive paste and the organic binder to have an appropriate viscosity and drying rate.

According to the exemplary embodiment of the present invention, the content of solvent may be 40 to 50 parts by weight per 100 parts by weight of conductive paste.

The solvent according to an exemplary embodiment of the present invention may include the eucalyptol in order to exhibit the low viscosity and low boiling point characteristics. In addition, the solvent may further include dihydroxy terephthalic acid in order to exhibit the low boiling point and low viscosity characteristics and may further include at least one selected from a group consisting of p-cymene, α-pinene, and d-limonene to have the proper viscosity.

The solvent may include eucalyptol, p-cymene, and dihydroxy terephthalic acid. The solvent may allow the conductive paste to have the boiling point of 120° C. or less, preferably, the boiling point of 110° C. or less. As the boiling point becomes low, the drying rate of the conductive paste is fast. In addition, the solvent may have the low viscosity characteristics to be suitable for the gravure printing.

In order for the solvent to have the low viscosity and low boiling point characteristics optimized for the gravure printing, the content of eucalyptol may be 30 to 60 parts by weight, the content of p-cymene may be 20 to 40 parts by weight, and the content of dihydroxy terephthalic acid may be 20 to 30 parts by weight, for the solvent according to the exemplary embodiment of the present invention.

As the particle size of the conductive metal powder becomes small, the specific surface area is increased, such that the viscosity of the paste is increased. Therefore, the solvent may include 30 to 40 parts by weight of p-cymene per 100 parts by weight of solvent.

The conductive paste and the organic binder have the low viscosity and low boiling point characteristics by the solvent according to the exemplary embodiment of the present invention.

Since the conductive paste and the organic binder have the low boiling point characteristics, they may be dried fast even though the conductive paste is printed on the dielectric sheet. Therefore, when the conductive paste is printed by the fast printing method such as the gravure printing, the printed electrode is dried fast to prevent the printing pattern defects such as spreading or the like.

FIG. 2 is a graph showing a drying time of the conductive paste according to the exemplary embodiment of the present invention.

Referring to FIG. 2 showing the graph, line A indicates the drying rate of the conductive paste including the nickel powder that is a conductive metal, 5 parts by weight organic binder for the entire conductive paste, and the dihydroxy terephthalic acid as a solvent, line B indicates the drying rate of the conductive paste including the nickel powder that is a conductive metal, 6 parts by weight organic binder for the entire conductive paste, and dihydroxy terephthalic acid as a solvent, and line C indicates the drying rate of the conductive paste including the nickel powder that is a conductive metal and 6 parts by weight organic binder per 100 parts by weight of conductive paste, and a solvent consisting of 20 parts by weight of dihydroxy terephthalic acid, 50 parts by weight of eucalyptol, and 30 parts by weight of p-cymene per 100 parts by weight of solvent.

When the conductive paste is dried at 100° C., the drying rate thereof was compared by comparing the amount of residual solvent according to the drying time.

Referring to FIG. 2, it takes about 4 minutes to dry the conductive paste including the solvent consisting of 20 parts by weight of dihydroxy terephthalic acid, 50 parts by weight of eucalyptol, and 30 parts by weight of p-cymene per 100 parts by weight of solvent according to the exemplary embodiment of the present invention. However, it takes about 8 minutes to dry the conductive paste including only the dihydroxy terephthalic acid.

That is, it can be appreciated that the drying rate of the conductive paste is twice as fast as that of the conductive paste corresponding to Comparative Example represented by line A and line B.

The drying rate of the conductive paste is faster than that of the conductive paste proposed in Comparative Example as the temperature is increased. It could be appreciated that when being dried at 110° C., the drying rate thereof is about three times as fast as that of the conductive paste of Comparative Example.

In manufacturing the multilayer ceramic capacitor, when printing the inner electrode by the gravure printing method, the conductive paste is printed at the thinner thickness, thus the printing speed may be faster.

For example, when the printing speed of the gravure printing is 50 m/min and the length of a drying path is approximately 10 m, the printed conductive paste should be dried within 12 seconds.

In the case of the conductive paste used for the general screen printing, the drying time is approximately 40 seconds. Therefore, when the conductive paste used for the screen printing is used for the gravure printing, the conductive paste is not dried even though it passes through the drying path, the phenomenon that the conductive paste is smeared or spread to other ceramic sheets may occur.

However, according to the exemplary embodiment of the present invention, since the conductive paste has the low boiling point and the fast drying rate, the drying rate thereof is three times as fast as that of the conductive paste used for the screen printing. As a result, the conductive paste may be dried within 12 seconds even though the gravure printing is applied.

The conductive paste includes the conductive metal powder in order to maintain the electrical conductivity. In particular, at least one selected from a group consisting of Ni powder, Ag powder, Cu powder, and Pd powder may be used but is not limited thereto.

The conductive metal powder particles may have the size of 10 nm to 200 nm to be applied to the gravure roll pattern. Meanwhile, the conductive paste may include 45 to 50 parts by weight of conductive metal powder per 100 parts by weight of conductive paste in order to maintain the film density of the inner electrode when forming the inner electrode.

If the conductive paste includes the conductive metal powder below 45 parts by weight, it is difficult to maintain the film density of the inner electrode and if the conductive paste includes the conductive metal powder over 50 parts by weight, the specific surface area thereof is increased and the viscosity thereof is increased accordingly. As a result, the conductive paste may include 45 to 50 parts by weight of conductive metal powder.

A method for manufacturing a multilayer ceramic electronic component according to another exemplary embodiment of the present invention prepares a ceramic sheet for a multilayer ceramic electronic component. The ceramic sheet is manufactured by applying slurry using a dielectric powder including ceramic to a film such as a carrier film.

According to the exemplary embodiment of the present invention, since the conductive paste and the organic binder have the low viscosity characteristics, the conductive paste may be printed into the thin film inner electrode. In particular, when using the gravure printing method in order to print the thin film inner electrode, the conductive paste may easily enter or escape into or from the gravure roll pattern even though it is applied to the micro pattern, such that the printing can be uniform.

In order to manufacture the multilayer ceramic electronic component according to the exemplary embodiment of the present invention, the conductive paste for the inner electrode including the conductive metal powder for manufacturing the inner electrode for the multilayer ceramic electronic component, the organic binder including the acryl-based resin, the butyral-based resin, the cellulose-based resin for dispersing the conductive metal powder, and the solvent including the eucalyptol is prepared.

The inner electrode is formed by printing the conductive paste on the ceramic sheet and the inner electrode may be printed by the screen printing method or the gravure printing method.

Since the conductive paste according to the exemplary embodiment of the present invention has the low boiling point and low viscosity characteristics, it may easily enter or escape into or from the gravure roll pattern even though the gravure printing is applied and may be rapidly dried even for the high-speed gravure printing.

Thereafter, the multilayer main body, in which the plurality of ceramic layers are formed by cutting and stacking the ceramic sheet printed with the inner electrode are stacked, is formed. The first external electrode 15a and the second external electrode 15b are formed on both ends of the multilayer main body as shown in FIG. 1, thereby manufacturing the multilayer ceramic electronic component.

The multilayer ceramic electronic component according to the present invention may be a multilayer ceramic inductor, a multilayer ceramic capacitor, or the like, but is not limited thereto and may be applied to various multilayer ceramic electronic components.

The solvent may further include the dihydroxy terephthalic acid and the solvent may further include at least one selected from a group consisting of the p-cymene, the α-pinene, and the d-limonene, thereby making it possible to implement the low viscosity and low boiling point characteristics of the organic binder and the conductive paste including the solvent according to the exemplary embodiment of the present invention.

In particular, the content of eucalyptol may be 30 to 60 parts by weight for the solvent, the content of dihydroxy terephthalic acid may be 20 to 30 parts by weight, and the content of at least one selected from the group consisting of the p-cymene, the α-pinene, and the d-limonene may be 20 to 40 parts by weight. As a result, the conductive paste or the organic binder maintains the low boiling point characteristics to increase the drying rate when the gravure printing is applied.

In particular, the solvent includes the eucalyptol, the dihydroxy terephthalic acid, and the p-cymene and the content of p-cymene may be 30 to 40 parts by weight. As a result, the solvent maintains the low viscosity characteristics, such that the inner electrode may be printed to have the small surface roughness without the printing spreading when the gravure printing is applied.

The conductive metal powder for the conductive paste may further include at least one selected from a group consisting of the Ni powder, the Ag powder, the Cu powder, and the Pd powder.

The content of conductive metal powder for the conductive paste may be 45 to 50 parts by weight, such that the conductive paste may have the low viscosity characteristics while maintaining the excellent film density when forming the inner electrode.

Referring to FIG. 1, a multilayer ceramic electronic component according to another exemplary embodiment of the present invention may be configured to include the multilayer main body formed by stacking the plurality of ceramic layers therein, the plurality of inner electrodes 12a and 12b formed by printing on the plurality of ceramic layers the conductive paste including the conductive metal powder for manufacturing the inner electrode for the multilayer ceramic electronic component, the organic binder including the acryl-based resin, the butyral-based resin, or the cellulose-based resin to disperse the conductive metal powder, and the solvent including the eucalyptol, and the first external electrode 15a and the second external electrode 15b formed at both ends of the multilayer main body to be electrically connected to the inner electrodes 12a and 12b.

The solvent according to the present invention has the low viscosity and the low boiling point, thereby making it possible to lower the defect rate when it is used for the gravure printing. Accordingly, the gravure printing may print the thin film inner electrode as compared to the screen printing and thus, the smaller and thinner multilayer ceramic electronic component may be provided.

In addition, according to the exemplary embodiment of the present invention, the solvent has good dissolvent with the organic binder included in the conductive paste, thereby making it possible to easily produce the conductive paste.

The solvent according to the exemplary embodiment of the present invention has the poor dissolvent with the ceramic sheet to prevent the sheet attack phenomenon when the conductive paste using the solvent is printed on the ceramic sheet, thereby making it possible to stably form the inner electrode and then, prevent the occurrence of cracks of the ceramic sheet or the inner electrode.

Further, the exemplary embodiment of the present invention may maintain the low viscosity while including 40 parts by weight or more of the conductive metal powder of 200 nm or less, thereby making it possible to increase the film density of the inner electrode and maintain the excellent electrical connection when forming the inner electrode.

Since the conductive paste and the organic binder have the low viscosity characteristics, the conductive paste may be printed into the thin film inner electrode. In particular, when using the gravure printing method in order to print the thin film inner electrode, the conductive paste may easily enter or escape into or from the gravure roll pattern even though it is applied to the micro pattern, such that the printing can be uniform.

The multilayer ceramic electronic component according to the exemplary embodiment of the present invention has the low viscosity of the conductive paste, such that the dispersion characteristics of the conductive paste can be improved. In addition, since the conductive paste for the inner electrode according to the present invention includes the conductive metal powder of 200 nm or less, the surface of the inner electrode is well leveled to have a smooth shape. That is, the inner electrode having the relatively small surface roughness may be formed and the inner electrode having the smooth surface may be formed accordingly even though the thin film inner electrode is formed.

FIG. 3A is a graph showing viscosity of an organic binder according to a solvent of an exemplary embodiment of the present invention.

Line A is a graph showing the viscosity of the organic binder when the solvent including the dihydroxy terephthalic acid and the eucalyptol is applied, line B is a graph showing the viscosity of the organic binder when the solvent including the dihydroxy terephthalic acid, the eucalyptol, and the α-pinene is applied, line C is a graph showing the viscosity of the organic binder when the solvent including the dihydroxy terephthalic acid, the d-limonene, and the eucalyptol is applied, and line D is a graph showing the viscosity of the organic binder when the solvent including the dihydroxy terephthalic acid, the eucalyptol, and the p-cymene is applied.

It can be appreciated that line B including the dihydroxy terephthalic acid, the eucalyptol, and the α-pinene has the viscosity of 600 cps and that line A indicating the organic binder to which the solvent including the dihydroxy terephthalic acid and the eucalyptol is applied has the viscosity of 500 cps or less. That is, it can be appreciated that the viscosity of the organic binder is smaller than that of the organic binder to which the solvent including the dihydroxy terephthalic acid is applied.

In addition, it can be appreciated that line C and line D each including the dihydroxy terephthalic acid and the eucalyptol and the p-cymene or the d-limonene have the viscosity of about 300 cps, which is relatively very low viscosity.

In particular, it can be appreciated that the viscosity of the organic binder further including the p-cymene or the d-limonene is further reduced 33% or more than that of the organic binder to which the solvent including only the dihydroxy terephthalic acid and the eucalyptol is applied.

FIG. 3B is a graph showing viscosity of the conducive paste according to the solvent of the exemplary embodiment of the present invention.

Line A is a graph showing the viscosity of the conducive paste when the solvent including the dihydroxy terephthalic acid and the eucalyptol is applied, line B is a graph showing the viscosity of the conducive paste when the solvent including the dihydroxy terephthalic acid, the eucalyptol and the α-pinene is applied, line C is a graph showing the viscosity of the conducive paste when the solvent including the dihydroxy terephthalic acid, the d-limonene, and the eucalyptol is applied, and line D is a graph showing the viscosity of the organic binder when the solvent including the dihydroxy terephthalic acid, the eucalyptol, and the p-cymene is applied.

It can be appreciated that the viscosity of the conductive paste to which the solvent including the dihydroxy terephthalic acid and the eucalyptol is applied has a value of 1000 cps or less, while the conductive paste to which the solvent further including the α-pinene is applied has the viscosity of 1100 cps or less, which has lower viscosity than that of the solvent including only the dihydroxy terephthalic acid.

Further, it can be appreciated that the conductive paste to which the solvent further including the d-limonene is applied has the viscosity of 800 cps or less, in particular, the conductive paste to which the solvent further including the p-cymene is applied has the viscosity of 700 cps or less.

That is, it can be appreciated that the viscosity of the solvent further including the p-cymene is further reduced 35% or more than that of the solvent including the dihydroxy terephthalic acid and the eucalyptol.

The exemplary embodiment of the present invention may lower the viscosity of the organic binder by applying the solvent including the dihydroxy terephthalic acid and the eucalyptol as well as the viscosity of the conductive paste.

In addition, the viscosity of the solvent further including the p-cymene or the d-limonene may be further lowered, such that the conductive paste easily entering and escaping into and from the micro gravure roll pattern when the gravure printing is used can be manufactured.

FIGS. 4A and 4B are graphs showing the viscosity of the organic binder of the conductive paste and the viscosity of the conductive paste when the organic binder includes the p-cymene.

Referring to FIG. 4A, it can be appreciated that the viscosity of the organic binder is minimized when the content of p-cymene is 30 parts by weight. That is, when the solvent further includes 30 parts by weight or more of p-cymene, it can be appreciated that the viscosity of the organic binder is relatively very low.

However, it can be appreciated that if the content of p-cymene is 70 parts by weight or less in the solvent, the solvent and the organic binder are completely dissolved, but if it exceeds 40 parts by weight, the change rate of the viscosity is uniform.

Therefore, it can be appreciated that the dissolvent for the organic binder is degraded in section B exceeding 70 parts by weight and thus, the solvent is not mixed with the organic binder and the mixing solution is diluted and the effect is almost constant when the p-cymene over 40 parts by weight is added.

That is, it can be appreciated that if the content of p-cymene included in the solvent exceeds 70 parts by weight, the dissolvent for the organic binder of the conductive paste is degraded, such that it is difficult to mix the conductive paste.

In addition, referring to FIG. 4B, it can be appreciated that the viscosity of the conductive paste is minimized when the content of p-cymene reaches 30 to 40 parts by weight in the solvent.

That is, when the p-cymene is further included in the solvent, the low boiling point and low viscosity characteristics may be shown and in particular, when the content of p-cymene is 30 to 40 parts by weight, the organic binder and the conductive paste may maintain the optimal low viscosity characteristics.

As set forth above, the exemplary embodiment of the present invention provides the conductive paste for an inner electrode capable of forming the inner electrode with the improved electrical characteristics and electrical connection by providing the conductive paste solvent for the inner electrode having the relatively low boiling point and low viscosity characteristics, and the multilayer ceramic electronic component having the same.

While the present invention has been shown and described in connection with the exemplary embodiments, it will be apparent to those skilled in the art that modifications and variations can be made without departing from the spirit and scope of the invention as defined by the appended claims.

What is claimed is:

1. A multilayer ceramic electronic component, comprising:
a multilayer main body comprising a plurality of ceramic layers and a plurality of inner electrodes, wherein the ceramic layers and inner electrodes are alternately stacked in the multilayer main body; and
an external electrode disposed on an outer surface of the multilayer main body to be electrically connected to the inner electrodes,
wherein the inner electrodes are formed of a conductive paste comprising a conductive metal powder, an organic binder including at least one selected from a group consisting of an acryl-based resin, a butyral-based resin and a cellulose-based resin, and a solvent including eucalyptol and dihydroxy terephthalic acid, respectively, wherein the inner electrodes are formed by being printed on the ceramic layers.

2. The multilayer ceramic electronic component of claim 1, wherein the solvent further includes at least one selected from a group consisting of p-cymene, α-pinene, and d-limonene.

3. The multilayer ceramic electronic component of claim 2, wherein the content of eucalyptol is 30 to 60 parts by weight, the content of dihydroxy terephthalic acid is 20 to 30 parts by weight, the content of at least one selected from a group consisting of p-cymene, α-pinene, d-limonene is 20 to 40, per 100 parts by weight of solvent.

4. The multilayer ceramic electronic component of claim 3, wherein the solvent includes p-cymene and the content of p-cymene is 30 to 40 parts by weight per 100 parts by weight of solvent.

5. The multilayer ceramic electronic component of claim 1, wherein the conductive metal powder is at least one selected from a group consisting of Ni powder, Ag powder, Cu powder, and Pd powder.

6. The multilayer ceramic electronic component of claim 1, wherein the content of conductive metal powder is 45 to 50 parts by weight per 100 parts by weight of conductive paste.

7. The multilayer ceramic electronic component of claim 1, wherein the size of the conductive metal powder particles is 200 nm or less.

* * * * *